(12) United States Patent
Bele et al.

(10) Patent No.: US 6,235,182 B1
(45) Date of Patent: May 22, 2001

(54) SOLUTION FOR PRETREATMENT OF ELECTRICALLY NON-CONDUCTIVE SURFACES, AND METHOD OF COATING THE SURFACES WITH SOLID MATERIAL PARTICLES

(75) Inventors: Marjan Bele, Ljubljana (SI); Jürgen Otto Besenhard, Graz (AT); Stane Pejovnik, Ljubljana (SI); Heinrich Meyer, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/112,880

(22) Filed: Jul. 9, 1998

(30) Foreign Application Priority Data

Jul. 10, 1997 (DE) .............................................. 197 31 186

(51) Int. Cl.⁷ ............................... C25D 5/54; C25D 5/56; C25D 5/34; B05D 1/36; H01B 1/00
(52) U.S. Cl. ........................ 205/159; 205/162; 205/164; 205/210; 427/96; 427/122; 427/123; 427/197; 427/203; 252/500
(58) Field of Search ............................. 252/500; 427/96, 427/122, 123, 197, 203; 205/159, 164, 210, 162

(56) References Cited

U.S. PATENT DOCUMENTS

| | | | |
|---|---|---|---|
| 4,331,572 | 5/1982 | Tomasi et al. ........................ 524/238 |
| 4,417,016 | 11/1983 | Cline et al. ........................... 524/156 |
| 4,874,477 | 10/1989 | Pendleton ............................... 204/15 |
| 5,139,642 | 8/1992 | Randolph et al. ..................... 205/125 |
| 5,476,580 | * 12/1995 | Thorn et al. .......................... 205/122 |
| 5,849,280 | * 12/1998 | Rechelbacher et al. .......... 424/70.11 |
| 5,898,043 | * 4/1999 | Uemae et al. ........................ 523/204 |

FOREIGN PATENT DOCUMENTS

| | | |
|---|---|---|
| 0089213 | 3/1983 | (EP) . |
| 2115829 | 9/1983 | (GB) . |
| PCT/DE92/00788 | 9/1992 | (WO) . |

* cited by examiner

*Primary Examiner*—Edna Wong
(74) *Attorney, Agent, or Firm*—Paul & Paul

(57) ABSTRACT

A solution for the pretreatment of electrically non-conductive surfaces and a method for coating surfaces with solid matter particles, for example carbon black, graphite, silicon dioxide, aluminum oxides, transition metal chalcogenides and titanium dioxide. Furthermore, the invention relates to a production method for the solution also. The solution contains a solvent, polyelectrolytic compound as a coagulation trigger, and a charged surfactant which has opposite polarity relative to the polyelectrolytic compound. After pretreatment of surfaces with the solution, the surfaces are then brought into contact with a dispersion containing the solid matter particles.

13 Claims, No Drawings

SOLUTION FOR PRETREATMENT OF ELECTRICALLY NON-CONDUCTIVE SURFACES, AND METHOD OF COATING THE SURFACES WITH SOLID MATERIAL PARTICLES

SPECIFICATION

The invention relates to a solution for the pretreatment of electrically non-conductive surfaces and a method for coating surfaces with solid matter particles, for example carbon black, graphite, silicon dioxide, aluminium oxides, transition metal chalcogenides and titanium dioxide. Furthermore, the invention relates to a production method for the solution also.

It is known to coat electrically non-conductive surfaces especially with carbon black or graphite or mixtures of these materials; the materials being present in the form of particles, for example with a particle diameter of less than approx., 3 $\mu$m (for example EPO 200 398 B1).

An improvement relative to the previously mentioned invention is represented by a method with substrate-induced coagulation of the dispersion (WO-A 93/11881 and WO-A 92/19092). In a first step in this procedure water-soluble polymers, preferably polyelectrolytic compounds are adsorbed on the substrate surfaces. In the subsequent second step the adsorbed polymer compounds initiate the substrate-induced coagulation of the substrate, the substrate being plunged into the dispersion. As examples of polymer of this type, gelatine, polyvinylpyrrolidones, salts of carboxymethylcellulose, polyacrylic acid and polyvinyl alcohol are mentioned.

This method has the advantage that the carbon particles coagulate predominantly on the surfaces which are brought into contact with the polyelectrolytic solution and form an adhesive carbon coating. This coating in contrast to the coating produced according to EP O 200 398 B1 cannot be removed again even when rinsed with water. Because of this, it is possible to rinse off completely any dispersion residue adhering to the surfaces, so that the danger of contamination from areas of the surface which are not to be coated, for example copper surfaces on circuit boards, is reduced. Altogether, after a further electrolytic metal deposition a sufficiently adhesive bond of the metal layers is achieved.

In the named publications it is described how cationic polyelectrolytic compounds with the relatively low charge density of below 0.5 milliequivalents per gram of compounds represent good coagulation initiators.

In addition it is shown in detail that the composition of a coagulatable dispersion is also important for the adsorption of solid material particles. The dispersion is formed by using stabilising surfactants and salts in the dispersion which destabilise the dispersion. The concentration of salts should be about 0.05 mol/liter.

A typical example of a polyelectrolytic compound with a relatively low charge density is gelatine. This denatured protein consists of a combination of numbers of amino acids in irregular sequence. In particular, glycine, prolin, alanine, hydroxyprolin, glutamine acid and other amino acids are contained in gelatine (I. Tomka, *Chimia,* 37, (2) (1983), Pages 33 to 40).

M. S. Celik as well as J. C. Abram and M. C. Bennet have described in *J. Colloid and Interface Science,* 129 (2) (1989) Pages 428 to 440 and 27 (1) (1968) Pages 1, to 6, respectively the adsorption of surface-active agents on carbon black particles in aqueous dispersion. In this case, the dispersion of carbon black particles was stabilised by a repellent surface charge barrier or by steric interactions of the adsorbed surfactant molecules. In most cases adsorption isotherms were observed with Langmuir characteristic with a wide plateau region for most types of carbon black.

In EP O 583 426 B1, a method for the electroplating of the surfaces of a non-conductive material, in which the surfaces are brought into contact with a liquid carbon black dispersion, which contains carbon black particles, a surfactant for dispersing the carbon black and a dispersing medium and in which the surfaces are dried subsequently and after that brought into contact with a graphite dispersion. The dispersion contains a surfactant and a dispersing medium besides the graphite particles. After that, the electrically conductive layers are coated electrolytically with metal. By coating the surfaces first with carbon black, an adhesive graphite and metal coating can be obtained.

A part of the described methods has the disadvantage that a reliable and irreversible coating with solid matter particles is not possible. For adhesive coating therefore, the additional pretreatment of the surfaces with polyelectrolytic compounds is proposed so that the solid matter particles from the dispersion are coagulated irreversibly on the surfaces. Because of this, coating of the substrates in selected areas is also made possible, since the polyelectrolytic compounds (coagulation initiators) can be selected such that they are adsorbed either preferably on hydrophobic or hyrophilic surfaces or those capable of forming hydrogen bonds. In this way, the non-conductive surfaces on circuit boards can be covered with a stronger carbon black layer than the copper surfaces.

The particle coating which is performed by means of substrate-induced coagulation has the disadvantage however, that optimal accommodation of the polyelectrolytic compounds onto various substrate surfaces is only possible in a qualified manner, since only a limited number of compounds of this type is available. For example it has emerged that coating of polypropylene surfaces with carbon black according to known methods is simply inadequate.

Therefore the problem underlying the present invention is to avoid the disadvantages of the known treatment solutions and methods and to find in particular a suitable solution for the pretreatment of electrically non-conductive surfaces and a method for coating varying surfaces with solid matter particles. Above all, the method should be carried out without problems, and it should also be possible to be able to coat surfaces of highly hydrophobic character with no difficulty.

This problem is solved by the solution according to the present invention.

The solution according to the invention serves for pretreating electrically non-conductive surfaces, preferably for pretreating polymers. Said solution contains a solvent, preferably water, also at least one polyelectrolytic compound as a coagulation trigger and additionally at least one charged surfactant which is of opposite polarity relative to the polyelectrolytic compound and by means of which the charge of the polyelectrolytic compounds can be at least partly compensated for or overcompensated.

For coating these surfaces with solid material particles, the procedure is carried out using the following procedure steps:

a) treatment of the surfaces with the pretreatment solution;

b) coating with the solid material particles by bringing the surfaces into contact with a dispersion containing the solid material particles, a second surfactant stabilising the dispersion against coagulation of the particles and a salt destabilising the dispersion.

In the first procedure step, the coagulant initiator is adsorbed on the surfaces of substrates, made of for example polytetrafluorethylene, glass, metals, polyethylene, epoxy resins and cellulose. In the second procedure step the solid material particles, for example for the group of carbon black, graphite, silicon dioxide, aluminium oxides, transition metal chalcogenides, for example molybdenum disulphide and titanium dioxide, are coagulated on the pretreated surfaces. The charge density of the polyelectrolytic compounds in the pretreatment solution is controlled by using the amount of additionally contained charged surfactants for controlling the net charge density on the polyelectrolytic compounds.

Furthermore, in the second procedure step a coagulatable dispersion with a defined coagulation behaviour is brought into contact with the pretreated substrate, so that a maximum quantity of solid matter particles are coagulated on the substrate.

For pretreating the non-conductive surfaces, special polyelectrolytic compounds are used, which are soluble in the solvent and which must fulfill a range of predetermined criteria: in the first place the compounds must be adsorbed on the substrate surface powerfully and irreversibly, so that the compounds can no longer be removed from the surface even by subsequent rinsing with a solvent. Furthermore, the polyelectrolytic compounds must not have a high charge density i.e. the number of charges per mass of the compound molecule must be as small as possible. Thirdly, the polyelectrolytic compounds which have a long hydrophobic molecule portion, should not have too small a charge density in order to avoid coagulation of the compounds already in the pretreatment solution.

Macromolecules, which do not adopt a flat molecular structure in the solution and which in a preferred configuration or conformation cause a substrate-induced coagulation through bond forming mechanisms across its molecule ends or by means of loop-shaped molecule constituents, which are directed towards the solvent molecules, are particularly well suited to pretreating non-conductive surfaces since they can be formed or modified with a small charge density and because they are capable of extensive interactions with other materials. The charge density of the dissolved polyelectrolytic compounds has a considerable effect on the quantity adsorbed on the surfaces, since the adsorption by a combination of charge neutralisation depends on the surface charge of the solid material particles (Coulomb interaction). In addition, the adsorption capacity is based also on the hydrophobic and van der Waals interactions as well as the ability to form hydrogen bonds. Thus the adsorbed quantity is influenced by the interactions within a polyelectrolytic molecule, between several polyelectrolytic compounds amongst one another and by polyelectrolytic compounds with the substrate surface.

Basically cationic anionic and betaine-like materials can be used as polyelectrolytic compounds. For example, those suitable are polyacrylates, which may contain, to improve their solubility, a certain number of ammonium groups (for example compounds of the BASOPLAST® series by the compnay BASF, Germany), peptides, such for example as albumins, copolymers of acrylamide and methacrylamide with salts or quaternising products of aminoacrylates and other polyelectrolytic compounds, containing simple or substituted ammonium groups, for example polydiallyl-dimethyl ammonium chloride. Basically, flocculators can also be used, for example SUPERLOC® from the company American Cyanamid, USA, ETADURIN™ from the company Akzo Netherlands, SEDIPUR™ from the company BASF, MAFNAFLOC™ the company Allied colloids, USA, NALCOLYTE® from the company Nalco, USA, SANFLOC™ from the company Sanyo, Japan and SEPARIN™ from the company Dow Chemicals, USA. Also suitable are quaternised polyvinylpyrrolidones and anionic polyelectrolytic compounds, for example the sodium salts of carboxymethyl cellulose, alginic acid and polyvinyl phosphoric acid.

A typical example of a polyelectrolytic compound with a relatively low charge density is gelatine. Good results are obtained with this material. This denatured protein consists of a combination of numbers of amino acids in irregular series. In particular, glycine, prolin, alanine, hydroxyprolin, glutamine acid and other amino acids are contained in gelatine (I. Tomka, *Chimia*, 37 (2) (1983) Pages 33 to 40).

The adsorption behaviour for gelatine is of particular interest since this material is capable of especially important types of interaction. Of concern here are hydrophobic and Coulomb interactions.

It was established that the pretreated substrate surfaces with respect to the charge density of the dissolved polyelectrolytic compounds have a "memory" effect. It can be taken from this that the optimum quantity of adsorbed polyelectrolytic compounds on the substrate surfaces is obtained by adjusting the charge density. In order for this adjustment to take place, supplementarily charged surfactants, according to the present invention, are used by means of which the charge of the polyelectrolytic compound can be at least partly compensated for or even overcompensated. For example, the protein molecule of gelatine has a positive net charge with a pH value below the isoelectric point and works thus because of the then present ammonium groups as a cationic polymer.

The charge neutrality of the compound can be compensated for or overcompensated according to known methods by means of a pH value adjustment and according to the method according to the invention by adding charged surfactants, which are of opposite polarity relative to the polyelectrolytic compounds, and in the case of gelatine anionically charged surfactants.

By adding surfactants to the pretreatment solution a polyelectrolytic/surfactant complex (Symplex) is formed which by virtue of its small net charge density has a particularly high adsorbency on the substrate surface.

Contrary to the method by which the net charge is adjusted exclusively via the pH value, specifically suited pretreatment chemicals for a certain substrate which is otherwise difficult to coat can be selected by means of the added charged surfactants.

The concentrations of polyelectrolytic compounds and charged surfactants in the pretreatment solution are adjusted such that the calculated net charge density of the symplexes, which is obtained from the charge of the polyelectrolytic compounds, which is reduced by the charge of the surfactants mounts to by at most 0.5 milliequivalents per gram of dissolved polyelectrolytic compounds. The net charge density is given in milliequivalents of the positive or negative charges of the symplexes per unit mass of polyelectrolytic compounds. The net charge density is, in a specially preferred embodiment, preferably 0 to 0.15 milliequivalents per gram of dissolved polyelectrolytic compounds. It also emerges from this that the polyelectrolytic compounds contain one charge per approx. 500 to 7000 $CH_2$ groups.

Cationic polyelectrolytic compounds and anionic surfactants are preferably used. For example, gelatine can be used as a polyelectrolytic compound and an alkali salt from di-(iso-octyl)-succin-1-sulphonate can be used as a surfactant. The solution contains the surfactants preferably in a concentration of 0.01 to 0.4 units of mass, relative to the units of mass of the dissolved polyelectrolytic compounds. In a particularly preferred embodiment form, the surfactants are contained in a concentration range of 0.2 to 0.3 units of mass of surfactant per unit of mass of polyelectrolytic compound.

The pretreatment solution in addition contains a solvent, preferably water. Alternatively organic solvents can also be used, for example alcohols, ketones, ethers or esters.

In order, during the production of pretreatment solution, to avoid the compound initiating coagulation being removed by adding the charged surfactants, a solution of surfactant is introduced via capillaries into the solution containing the polyelectrolytic compounds.

In the second procedure step, the surfaces are brought into contact, after rinsing with a solvent, preferably water, with a dispersion containing the solid material particles. This solution contains furthermore a second surfactant stabilising the dispersion against coagulation of the particles, for example a quaternary ammonium salt and a salt destabilising the dispersion.

It is important to coagulate the largest quantities possible of solid material particles on the substrate surface. For this purpose, the quantity of the second surfactant in the dispersion must be set in a favourable range. This surfactant exerts a reasonably good influence on the adsorption of the particles.

In order to optimise the parameters of the method it is thus required to determine the amount of adsorbed surfactant on the solid matter particles relative to the surfactant concentration in the dispersion. In order to carry out this measurement, the adsorption of the surfactant on the particles is determined by polyelectrolytic titration in the dispersion and by radiographic diffraction analysis in the air-dried dispersion. The plateau values obtained depend both upon the type of surfactant and the type of solid material particles.

It was further established that a maximum quantity of solid material particles is located on the substrate surfaces provided with adsorbed polyelectrolytic compounds when the concentration of the second surfactant in the dispersion is selected such that its adsorbed quantity on the particles directly provides a one-layer covering (monolayer). This implies that maximum particle adsorption takes place on the substrate surfaces when maximum surfactant coating on the particles is also achieved. According to a theoretical explanation for this result, the solid material particles are not dispersed adequately using a smaller surfactant concentration, and with a higher concentration, the surfactant competes with the particle coagulation on the substrate surface, with the result that, even in this case, the tendency to coagulate is smaller. In the case just mentioned, a surface which is charged with the same polarity is possibly also produced by means of which an adsorption of solid material particles is prevented.

Furthermore the ability of the dispersion to coagulate also depends upon the presence of dissolved salts. These salts stabilise the dispersion and thus promote the coagulation. Particularly suitable are simple alkali salts, earth alkali salts and salts of the first side group. For example, sodium acetate has been shown to be particularly suitable.

After treating with the dispersion, the substrate surfaces can be rinsed once again with solvent, preferably water, without the solid material particle layer being separated from the surface.

Subsequently, the surface which are coated with carbon black particles, graphite particles or mixtures of these particles can be coated, in a further procedure step c) electrolytically with metal, for example with copper, nickel, cobalt, palladium, gold or other noble metals, tin, zinc and alloys of these metals with one another or with other metals or with phosphorous or boron.

The non-conductive surfaces to be coated are normally pretreated before the presently described method with an etching procedure as well. For this purpose, normal etching means, for example Chrome VI salts or permanganate salts in a solution or concentrated sulphuric acid are used.

The treatment chemicals including the pretreatment solution, which includes the polyelectrolytic compounds, are normally brought into contact with the surfaces by submerging the substrates. However, the solution can also be applied to the surface by spraying, soaking or sprinkling. In the treatment of circuit boards the solutions are preferably conveyed via soaking nozzles into the plates being transported in a horizontal direction through a treatment unit. The plates can thereby be held in horizontal or vertical alignment.

The subsequent examples serve to example the invention further:

EXAMPLE 1

Firstly, sections were prepared from a circuit board laminate, made from FR4-material (flame retardant) and approx. 1.0 mm thick, and which was produced from epoxy resin, strengthened with glass fibre matting and also containing copper foils. The copper foils were etched with a mixture of concentrated hydrochloric acid and hydrogen peroxide in water. After that, the sections were rinsed for 2 minutes with water.

Next, the sections were treated for 1 minute with an aqueous solution containing 0.2% by weight gelatine (Fluka company, Germany Catalogue No. 48722) at 25° C. Several gelatine solutions contained moreover various amounts of an anionic surfactant (di-(iso-octyl)-succin-1-sulphonate, sodium salt: AEROSOL OT™ by the Cytec company, USA). The 0.2% by weight gelatine solution was produced by dissolving an exactly weighed amount of gelatine in water at 60° C. and then keeping it for 12 to 24 hours at 4 to 10° C. The concentration of added surfactant was 0 to 0.8% by weight. For the most reproduceable supplement possible of surfactant to the gelatine solution, the surfactant was sprayed into the gelatine solution as a 0.008 molar solution by means of a capillary. In this way, a local coagulation of the gelatine was avoided. The capillary had a clear diameter of 0.3 mm, the gelatine solution was stirred continuously with a magnetic stirrer with a rotational speed of 200 rpm.

During treatment with the pretreatment solution, the sections were moved in a horizontal direction in the solution.

Next, the sections were removed from the solution and washed with water.

Subsequently, the section were submerged in the dispersion for 30 seconds. The aqueous dispersion contained carbon black (Printex XEZ from the company Degussa, Frankfurt) with a content of 1% by weight. This carbon black had a very large specific surface area. This was highly conductive carbon black with a surface of 950 $M^2/g$ measured according to the BET method, (which involves measuring the absorption of a gas on the surface of a highly dispersed solid, by measuring the difference in pressure of the gas in a container) and with an average particle diameter of 30 nm. The dispersion was stabilised with CTAB (cetyl trimethyl ammonium bromide). In addition, the dispersion contained sodium acetate as a destabilising salt. The dispersion was produced by mixing together 10 g XE2 (electrically conductive carbon black, Degussa-Hüls, Germany), 0.016 mol CTAB and 0.05 mol sodium acetate and after that adding enough water to the mixture to make up the weight of the mixture to 1 kg altogether. Subsequently, the mixture was stirred with a magnetic stirrer for 15 minutes at a rotational speed of 500 rpm at 40° C. and then stirred with a turbo mixer at 2000 rpm for one minute. The dispersion was then homogenized in an ultrasound both for 30 minutes at 80° C. and finally cooled again at room temperature.

Coating was carried out in a stirred plunging bath at room temperature, the circuit board sections being moved in a horizontal direction. The coating time was 2 minutes.

Then the sections were rinsed with water.

The thin layer of carbon black obtained extended over the entire sample. The electrical surface conductivity was measured after drying the samples with air. Since the thickness of the carbon black layer was not known, the surface conductivity was calculated using the van der Pauw method. With this method the conductivity of flat, isotropic samples can be examined if the conductive layer is uniformly thick and contains no insulating holes. This method can also be used, when the samples has any shape at all. The electrical conductivity can be determined according to the following equation:

$$exp(-\pi \cdot R_{PQ/RS} \cdot d\sigma) + exp(-\pi \cdot R_{QR/SP} \cdot d\sigma) = 1,$$

where d represents the thickness and σ the specific conductivity of the carbon black layer and P,Q,R and S represents four points of contact on the upper side of the sample near the edges. An electrical measuring current is firstly directed over the contacts Q and R, the potential differentiation between the contacts S and P being measured. The resistance which is measured in this way is $R_{QR/SP}$. The resistance $R_{RQ/RS}$ is determined after the contacts were exchanged. In this way the quantity of adsorbed carbon black could be judged from the measured resistance values; with a higher surface resistance a smaller carbon black layer being apparent at the same time.

The charge density of gelatine was determined by polyelectrolytic titration. This method is based on the stiochiometric reaction of the polycation gelatine with a standard polyanion (K. H. Wassmer, U. Schroeder, D. Horn, Makromol. Chem., 192 (1991) Pages 553 to 565). As a standard polyanion, a 0.001 normal solution of polyethene sulfonic acid, sodium salt (PES) was used. For determining negative charge densities, a 0.001 normal solution of N-cetylpyridinium chloride-monohydrate (N-CPC) was used. The use of a flow detector for determining the ζ-(zeta) potential, described by S. K. Dentel and K. M. Kingery in: J. AWWA, 81, (1989) Pages 85 to 94 also by P. Ay, A. Hemme, K. Pflug and R. Nitzsche, in Aufbereitungstechnik, 33(2) (1992), Pages 57 to 66) represents a generally applicable method for determining the charge neutralisation.

The titration end-point is indicated here by the disappearing flow potential. A known volume of solution V of the sample in a test cell was titrated with a standard electrolyte. The charge density in the 0.2% by weight gelatine solution is expressed according to the following equation:

Charge density $= C_S \cdot V_S / (V \cdot 0.002)$ [milliequivalents/g], where $C_S$ represents the concentration and $V_S$ is the volume of standard solution at the titration end-point. The obtained result in milliequivalents per unit of mass of the polyelectrolyte in the solution (100% polyelectrolytic compound) is used for easy characterisation of the compounds. A particle charge detector of the type PCDO2 by the Mutek company and a titrator of the type DL 21 from the Mettler company were used for carrying out the analysis.

A part of the coated samples was electrolytically electroplated in the conventional manner with a commercially available sulphuric acid copper plating bath.

In Table 1 typical values of the determined values of the charge density of gelatine, the surface conductivity and the results of the electroplating are shown.

TABLE 1

| Added Quantity [mMol/g] [ph value of solution] | Charge Density of gelatine [milli equivalent/g] | Surface conductivity [Ω⁻¹] | Plating quality |
|---|---|---|---|
| 0 (4.6) | 0.31 | $3.0 \cdot 10^{-5}$ | Bad |
| 0.15 (4.9) | 0.16 | $5.2 \cdot 10^{-5}$ | Good |
| 0.23 (5.0) | 0.08 | $5.5 \cdot 10^{-5}$ | Good |
| 0.30 (5.1) | 0.01 | $3.9 \cdot 10^{-5}$ | Good |
| 0.35 (5.3) | −0.04 | $1.8 \cdot 10^{-5}$ | useless |

EXAMPLE 2

In order to optimise the coating parameters it is important to know the quantity adsorbed in carbon black of surfactant contained in the dispersion.

Cationically stabilised carbon black was produced by mixing 10 g of carbon black of the type Printex XE2 with various quantities of CTAB (0.005 mol to 0.03 mol). Then enough water was added to produce a total quantity of 1 kg. The dispersion was homogenised, as in Example 1, by mixing, turbomixing and ultrasound treatment.

Subsequently, the dispersion was cooled to room temperature.

The obtained dispersion was then centrifuged for 30 minutes at a rotational speed of 18,000 rpm which is sufficient to precipitate all large particles. As a result, a remaining clarified solution was obtained. The centrifuging was carried out at room temperature. The concentration C of the surfactant in the remaining solution was determined by polyelectrolytic titration in the same manner as in Example 1. A known volume V of the sample in the test container was titrated with standard polyelectrolyte, in order to determine the concentration.

The concentration was calculated according to the following equation:

$$C = C_S \cdot V_S / V,$$

where $C_S$ represented the concentration and $V_S$ the titrated volume of standard solution.

The quantity of adsorbed surfactant was determined by the difference between the initial concentration $C_S$ and the final concentration in the remaining solution C, after the system had attained a state of equilibrium:

$$\Gamma = (C_I - C) / W,$$

where W represented the mass of the dispersed particles per unit of mass of dispersion.

In Table 2 a typical correlation between the initial concentration and the adsorbed quantity of CTAB on Printex XE2 carbon black in the original dispersion is reported. Both given values are given as a quantity of surfactant CTAB per unit mass of Printex XE2:

TABLE 2

| $C_1$ [mMol/g] | $\Gamma$ [mMol/g] |
|---|---|
| 0.95 | 0.949 |
| 1.14 | 1.135 |
| 1.33 | 1.314 |
| 1.52 | 1.487 |
| 1.62 | 1.575 |
| 1.80 | 1.736 |
| 1.9 | 1.801 |
| 2.28 | 1.801 |
| 2.47 | 1.817 |
| 2.85 | 1.823 |

The above results give the saturation concentration of adsorbed CTAB on the surface of Printex XE2 particles in the dispersion. This concentration was 1.8 mmol/g.

EXAMPLE 3

The carbon black dispersion was stabilised cationically with CTAB and then sodium acetate (NaOAc) was added. The dispersion was produced by mixing 10 g Printex XE2 and 0.05 mol NaOAc (Merck company, catalogue number 6268) and also varying quantities of CTAB in the range of 0.005 mol to 0.03 mol. Subsequently, enough water was added to produce a total amount of 1 kg. The dispersion was homogenised again by mixing, turbomixing and treating in an ultrasound bath as in Example 1. After that the dispersion was cooled at room temperature.

The adsorbed quantity of CTAB on Printex XE2 was determined as is described in Example 2.

In Table 3 a typical correlation between the initial concentration and the adsorbed quantity of CTAB on Printex XE2 in the original dispersion, which contains NaOAc as well, is reported. Both respectively given values are given as a quantity of the surfactant CTAB per unit of mass of Printex XE2.

The saturation concentration of adsorbed CTAB on Printex XE2 in the dispersion which contained 0.05 mol/kg NaOAc was 1.8 mmol/g.

TABLE 3

| $C_1$ [mMol/g] | $\Gamma$ [mMol/g] |
|---|---|
| 0.95 | 0.95 |
| 1.33 | 1.328 |
| 1.62 | 1.604 |
| 1.71 | 1.696 |
| 1.81 | 1.707 |
| 2.09 | 1.772 |
| 2.38 | 1.800 |
| 2.66 | 1.813 |
| 3.04 | 1.811 |

EXAMPLE 4

The carbon black dispersion was stabilised cationically with CTAB. The dispersion was produced by mixing 10 g SPECIAL BLACK 550™ (Regular Colour Furnace by the Degussa company, Germany) with varying amounts of CTAB in the range of 0.001 mol to 0.01 mol and then adding enough water to produce a total weight of 1 kg. The dispersion was then homogenised as in Example 1 (mixing, turbomixing, ultrasound, bath treatment) and finally cooled to room temperature.

The adsorbed quantity of CTAB on SPECIAL BLACK 550™ was determined as is described in Example 2. In Table 4 a typical correlation is reported between the initial concentration and the adsorbed amount of CTAB on SPECIAL BLACK 550™ in the original dispersion.

TABLE 4

| $C_1$ [mMol/g] | $\Gamma$ [mMol/g] |
|---|---|
| 0.099 | 0.097 |
| 0.143 | 0.139 |
| 0.191 | 0.179 |
| 0.285 | 0.250 |
| 0.380 | 0.313 |
| 0.570 | 0.324 |
| 0.761 | 0.327 |
| 0.950 | 0.324 |

The saturation concentration of absorbed CTAB on SPECIAL BLACK 550™ in the dispersion was afterwards 0.32 mmol/g.

EXAMPLE 5

A carbon black dispersion was stabilised anionically with AEROSOL OT™ (Cytec company, USA; sodium-di-(iso-octyl)-succin-1-sulphonate). For this purpose 10 g Printex XE2 were mixed with varying amounts of AEROSOL OT™ in the range of 0.004 mol to 0.03 mol and subsequently enough water was added to the mixture to produce a total amount of 1 kg. The mixture was once again homogenised as described in Example 1 and then cooled to room temperature.

The adsorbed amount of AEROSOL OT™ on Printex XE2 was determined in the same manner as previously described. In Table 5 a typical correlation is shown between the initial concentration and the adsorbed quantity of AEROSOL OT™ on Printex XE2 in the original dispersion. The respectively given pairs of values are expressed as a quantity of AEROSOL OT™ content per unit of mass on Printex XE2.

TABLE 5

| $C_1$ [mMol/g] | $\Gamma$ [mMol/g] |
|---|---|
| 0.48 | 0.477 |
| 0.96 | 0.954 |
| 1.20 | 1.153 |
| 1.44 | 1.265 |
| 1.73 | 1.323 |
| 2.11 | 1.324 |
| 2.50 | 1.328 |
| 2.88 | 1.322 |

The saturation concentration of the adsorbed AEROSOL OT™ on Printex XE2 in the dispersion was 1.32 mmol/g.

EXAMPLE 6

A carbon black dispersion was stabilised anionically with AEROSOL OT™. For this purpose 10 g Printex L6 from the Degussa company were mixed with varying amounts of AEROSOL OT™ in the concentration range of 0.001 mol to 0.01 mol and then diluted with enough water to produce a total quantity of 1 kg. The dispersion was once again homogenised according to the method described in Example 1 and then cooled to room temperature.

The adsorbed quantity of AEROSOL OT™ on Printex L6 was determined as described in Example 2. In Table 6 the determined concentrations and surface concentrations are given.

TABLE 6

| $C_1$ [mMol/g] | $\Gamma$ [mMol/g] |
|---|---|
| 0.096 | 0.096 |
| 0.192 | 0.182 |
| 0.288 | 0.226 |
| 0.384 | 0.248 |
| 0.480 | 0.262 |
| 0.576 | 0.268 |
| 0.768 | 0.266 |

The saturation concentration of adsorbed AEROSOL OT™ on Printex L6 in the dispersion was 0.27 mmol/g.

EXAMPLE 7

Example 1 was repeated. However, polypropylene plates were used a substrates. A carbon black layer with good conductivity on the substrate surfaces was attained. While electroplating on the one hand with nickel and on the other with copper, adhering and complete uniform metal coatings were obtained.

What is claimed is:

1. Method of coating electrically non-conducive surfaces of an article with solid material particles comprising the following procedure steps:
   a) pretreatment of the non-conductive surfaces by contacting said non-conductive surfaces with a solution for the pretreatment of the electrically non-conductive surfaces, which solution contains a solvent and at least one polyelectrolytic compound wherein the solution includes at least one charged surfactant which is of opposed polarity relative to the polyelectrolytic compounds and wherein the charge of the polyelectrolytic compound is at least partially compensated for or overcompensated, and
   b) coating the surfaces with the solid material particles by bringing the pretreated surfaces into contact with a dispersing containing the solid material particles, a second surfactant stabilizing the dispersion against coagulation of the particles and a salt destabilizing the dispersion.

2. Method according to claim 1, wherein the solid material particles are selected from the group consisting of carbon black, graphite, silicon dioxide, the aluminum oxides, the transition metal chalcogenides and titanium dioxide.

3. Method according to claim 2, wherein the surfaces coated with the solid material particles selected from the group consisting of carbon black, graphite, silicon dioxide, the aluminum oxides, the transition metal chalcogenides and titanium dioxide are coated electrolytically with a metal in a further procedure step c).

4. Method according to claim 3, characterized in that the surfaces are rinsed between the procedure steps a), b) and c) respectively.

5. Method according to one of the claims 1 to 3, characterised in that
   a quaternary ammonium salt is used as the second surfactant.

6. A method for coating electrically non-conductive surfaces with solid material particles, comprising the steps of:
   a) treatment of the surfaces with a solution containing a solvent and at least one polyelectrolytic compound, wherein at least one charged surfactant is additionally included, said at least one charged surfactant being of opposed polarity relative to the polyelectrolytic compounds, and wherein the charge of the polyelectrolytic compounds is at least compensated for or overcompensated;
   b) coating of the surfaces with the solid material particles by bringing the surfaces into contact with a dispersion containing the solid material particles, a second surfactant stabilizing the dispersion against coagulation of the particles and a salt destabilizing the dispersion; and
   c) wherein said salt comprises sodium acetate.

7. The method according to claim 6, wherein said solid material particles are selected from the group consisting of carbon black, graphite, silicon dioxide, the aluminum oxides, the transition metal chalcogenides and titanium dioxide.

8. The method according to claim 7, further including the step of electrolytically coating with a metal the surfaces coated with said solid material particles selected from the group consisting of carbon black, graphite, silicon dioxide, the aluminum oxides, the transition metal chalcogenides and titanium dioxide.

9. The method according to claim 8, further including the step of rinsing said surfaces between steps a) and b) after step b).

10. The method according to claim 6, wherein said second surfactant contains a quaternary ammonium salt.

11. A pretreatment solution for the pretreatment of electrically non-conductive surfaces prior to treatment with a solid material particle containing dispersion, the pretreatment solution containing a solvent and at least one polyelectrolytic compound, wherein at least one charged surfactant is additionally included, wherein said at least one charged surfactant is of opposed polarity relative to the polyelectrolytic compounds, and wherein the charge of the polyelectrolytic compounds is at least partly compensated for or overcompensated; and
   wherein the at least one polyelectrolytic compound is gelatine, and wherein the at least one charged surfactant is an alkali salt of di-(iso-octyl)-succin-1-sulphonate.

12. A pretreatment solution for the pretreatment of electrically non-conductive surfaces prior to treatment with a solid material particle containing dispersion, the pretreatment solution containing a solvent and at least one polyelectrolytic compound, wherein at least one charged surfactant is additionally included, wherein said at least one charged surfactant is of opposed polarity relative to the polyelectrolytic compounds, and wherein the charge of the polyelectrolytic compounds is at least partly compensated for or overcompensated;
   wherein the polyelectrolytic compounds and the charged surfactants are contained in such a concentration in the solution that the calculated net charge density of the polyelectrolytic compounds, obtained from the charge of the polyelectrolytic compounds, which is reduced by the charge of the surfactants, amounts to by maximum 0.5 milliequivalents per gram of dissolved polyelectrolytic compounds; and
   wherein the at least one polyelectrolytic compound is gelatine, and wherein the at least one charged surfactant is an alkali salt of di-(iso-octyl)-succin-1-sulphonate.

13. A pretreatment solution for the pretreatment of electrically non-conductive surfaces prior to treatment with a solid material particle containing dispersion, the pretreatment solution containing a solvent and at least one polyelectrolytic compound, wherein at least one charged surfactant is additionally included, wherein said at least one charged surfactant is of opposed polarity relative to the polyelectrolytic compounds, and wherein the charge of the polyelectrolytic compounds is at least partly compensated for or overcompensated;

wherein the net charge density of a polyelectrolytic/surfactant complex formed by the polyelectrolytic compound and the charged surfactant is from 0.01 to 0.15 milliequivalents per gram of the dissolved polyelectrolytic compounds; and wherein the at least one polyelectrolytic compound is gelatine; and wherein the at least one charged surfactant is an alkali salt of di-(iso-octyl)-succin-1-sulphonate.

\* \* \* \* \*